United States Patent
Koterasawa (10) Patent No.: US 7,649,417 B1
(45) Date of Patent: Jan. 19, 2010

(54) APPARATUS AND METHOD FOR INPUT STAGE AND BIAS CANCELLER FOR AN AUDIO OPERATIONAL AMPLIFIER

(75) Inventor: Matsuro Koterasawa, Koto-Ku (JP)

(73) Assignee: National Semiconductor Corporation, Santa Clara, CA (US)

( * ) Notice: Subject to any disclaimer, the term of this patent is extended or adjusted under 35 U.S.C. 154(b) by 132 days.

(21) Appl. No.: 11/752,827

(22) Filed: May 23, 2007

(51) Int. Cl.
 *H03F 3/45* (2006.01)
(52) U.S. Cl. .................................. 330/257; 330/261
(58) Field of Classification Search ............. 330/252, 330/253, 257, 260, 261
 See application file for complete search history.

(56) References Cited

U.S. PATENT DOCUMENTS

| | | | | |
|---|---|---|---|---|
| 6,636,111 | B1* | 10/2003 | Gross et al. | 330/261 |
| 6,965,267 | B2* | 11/2005 | Delorme et al. | 330/257 |
| 7,145,391 | B2* | 12/2006 | Harvey | 330/261 |

OTHER PUBLICATIONS

Erdi, George, "Amplifier Techniques for Combining Low Noise, Precision, and High Speed Performance," IEEE Journal of Solid-State Circuits, vol. SC-16, No. 6, Dec. 1981, 9 pgs.
Nishikawa, Y. et al., "A General-Purpose Wideband Operational Amplifier," Amplifier Techniques, IEEE International Solid-State Circuits Conference, Feb. 15, 1973, 4 pgs.
LM4562 "Dual High Performance, High Fidelity Audio Operational Amplifier," National Semiconductor Corporation, www.national.com, Oct. 2006, 33 pgs.

* cited by examiner

*Primary Examiner*—Khanh V Nguyen
(74) *Attorney, Agent, or Firm*—Darby & Darby P.C.; Matthew M. Gaffney (57) ABSTRACT

An input bias cancellation stage for an audio operational amplifier is provided. The input bias cancellation stage includes an input differential pair, a current mirror, and a bias duplicator transistor that substantially duplicates the input bias current. The bias duplicator transistor receives substantially the same emitter current as the transistors in the input differential pair, and has substantially the same Vce as the transistors in the input differential pair. The current mirror mirrors the duplicated bias current and subtracts it from the bases of the transistors in the input differential pair so that the input bias current is substantially cancelled.

16 Claims, 7 Drawing Sheets

APPARATUS AND METHOD FOR INPUT STAGE AND BIAS CANCELLER FOR AN AUDIO OPERATIONAL AMPLIFIER

FIELD OF THE INVENTION

The invention is related to operational amplifiers, and in particular but not exclusively, an input stage of an audio operational amplifier that substantially cancels out the input bias current of the audio operational amplifier.

BACKGROUND OF THE INVENTION

Audio operational amplifiers may be used for many applications, including phono preamplification, other forms of audio preamplification, balanced-to-single-ended conversion, adding audio signals, subtracting audio signals, high-pass filtering, low-pass filtering, graphic equalizing, and/or the like. Audio signals may be processed by circuitry for signal conditioning that includes audio operational amplifiers. The signal conditioning may include functions such as gain, mixing, filtering, driving an audio power amplifier, and/or the like.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to an input bias cancellation stage for an audio operational amplifier. The input bias cancellation stage includes an input differential pair, a current mirror, and a bias duplicator transistor that substantially duplicates the input bias current. The bias duplicator transistor receives substantially the same emitter current as the transistors in the input differential pair, and has substantially the same Vce as the transistors in the input differential pair. The current mirror mirrors the duplicated bias current and subtracts it from the bases of the transistors in the input differential pair so that the input bias current is substantially cancelled.

Figure 1A:
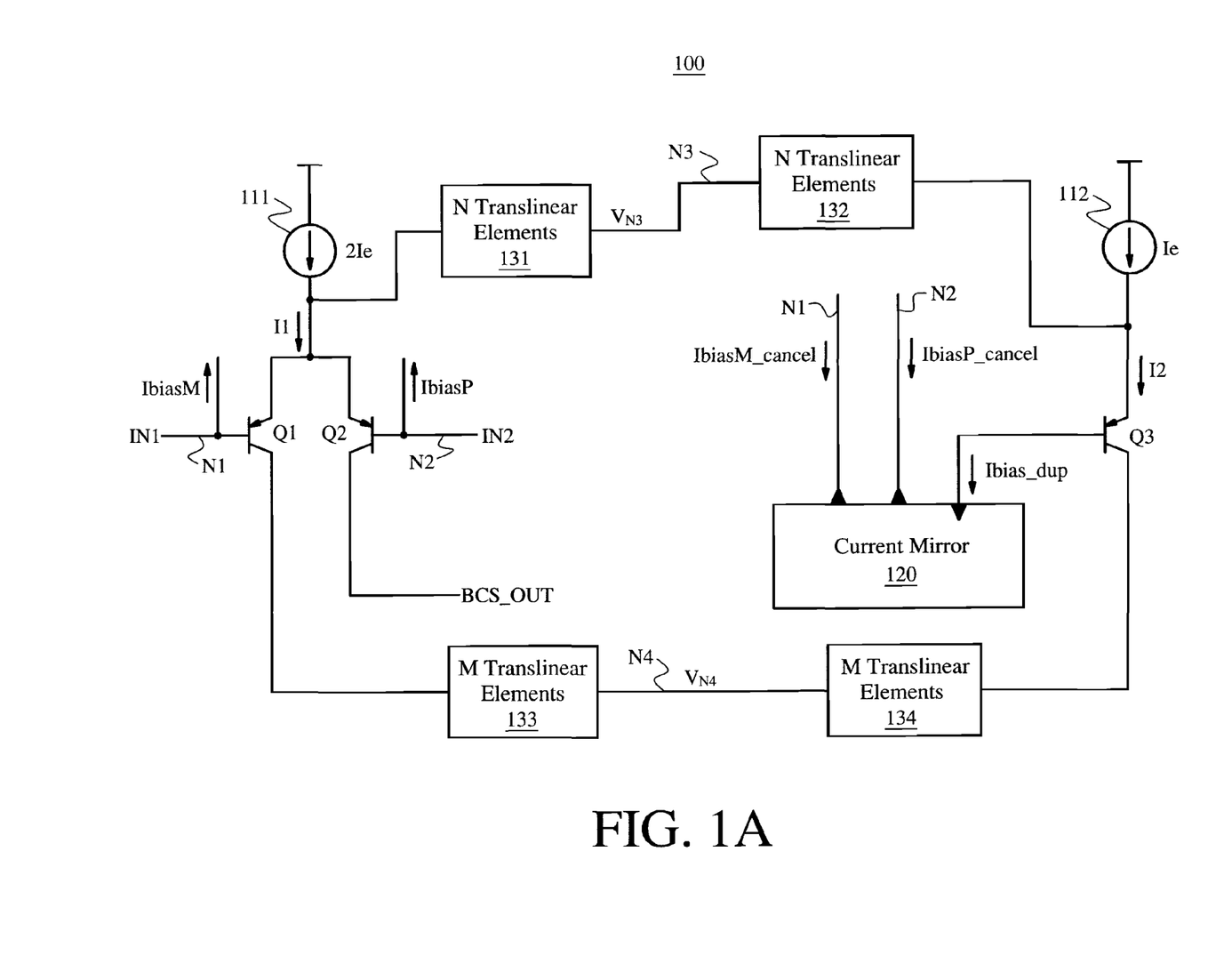
FIG. 1A shows a block diagram of an embodiment of a bias current cancellation circuit.

FIG. 1A shows a block diagram of an embodiment of bias cancellation stage 100. Bias cancellation stage 100 may be a first stage of an operational amplifier, a front end for an operational amplifier, or the like. Bias cancellation stage 100 includes current sources 111 and 112, transistors Q1-Q3, current mirror 120, and a plurality of translinear elements. In one embodiment, the plurality of translinear elements includes N translinear elements 131, N translinear elements 132, M translinear elements 133, and M translinear elements 134.

Transistors Q1 and Q2 form an input differential pair. The bases of transistors Q1 and Q2 are the inputs of the operational amplifier at nodes N1 and N2, respectively, and are configured to receive signals IN1 and IN2, respectively. Further, transistor Q1, transistor Q2, and current source 111 act together as a transconductance stage that converts differential input voltage IN1, IN2 to a current. Also, current mirror 120, current source 112, and the translinear elements operate together to provide input bias current cancellation so that the base currents of Q1 and Q2 are substantially cancelled. Bias current stage output signal BCS_OUT is provided to the next stage of the operational amplifier, which may be a gain stage, a cascode stage, or the like. For example, in one embodiment, the audio operational amplifier including bias cancellation stage 100, which is the input stage, following by one or more gain stages, followed by an output stage that provides the output of the audio operational amplifier. In other embodiments, the audio operational amplifier may be arranged in other ways. For example, virtually any audio operational amplifier topology known in the art may be employed, with bias cancellation stage 100 substituted in place of first stage of the audio operational amplifier that would otherwise be used in the known topology.

Current source 111 is arranged to provide current I1 to the common emitter of transistors Q1 and Q2. The emitters of transistors Q1 and Q2 each receive approximately half of current I1, so that the emitters of Q1 and Q2 each have an emitter current Ie, and current I1 is 2*Ie.

In a forward-biased bipolar transistor, the collector current is proportional to the base current, as given by the equation $I_C/I_B = \beta$, where $I_C$ is the collector current, $I_B$ is the base current, and $\beta$ is the forward-biased common-emitter current gain. Values for β typically fall from about 20 to 500, with 100 being a typical value for β. The emitter current and base current have a relationship given by: $I_E/I_B = \beta+1$, where $I_E$ is the emitter current. Since $\beta \gg 1$, this relationship is often simplifier as $I_E/I_B = \beta$. Because of this relationship, Q1 and Q2 each source a bias current, IbiasM and IbiasP respectively, of about $I_E/\beta$.

Additionally, bias duplicator transistor Q3 is arranged to provide a duplicate bias current Ibias_dup that is substantially equal to the input bias current. To ensure that Ibias_dup is substantially equal to IbiasM and IbiasP, transistor Q3 is arranged so that $V_{CE,Q3}$ is substantially the same as $V_{CE,Q1}$ and $V_{CE,Q2}$, so that $I_{E,Q3}$ is substantially the same as $I_{E,Q1}$ and $I_{E,Q2}$. Further, current source 112 is arranged to provide current I2 such that I2=I1/2, so that $I_{E,Q3}$ is substantially the same as $I_{E,Q1}$ and $I_{E,Q2}$. The translinear elements are arranged to ensure that $V_{CE,Q3}$ is substantially the same as $V_{CE,Q1}$ and $V_{CE,Q2}$.

Also, current mirror 120 is a 1:1:1 current mirror that is arranged to provide current IbiasM_cancel and IbiasP_cancel such that IbiasM_cancel and IbiasP_cancel are substantially equal to duplicate bias current Ibias_dup. In some embodiments, as explained in further detail with regard to FIG. 4 below, current mirror 120 further includes a current mirror correction resistor. The outputs of current mirror 120 are coupled to nodes N1 and N2. In this way, in one embodiment, current IbiasM_cancel and IbiasP_cancel are sinked from nodes N1 and N2 respectively. In this embodiment, since current IbiasM is sourced to node N1, current IbiasM_cancel is sinked from node N1, and current IbiasM and IbiasM_cancel are substantially equal, the bias current at node N1 is substantially cancelled. Similarly, in this embodiment, since current IbiasP is sourced to node N2, current IbiasP_cancel is sinked from node N2, and current IbiasP and IbiasP_cancel are substantially equal, the bias current at node N2 is substantially cancelled.

Figure 6:
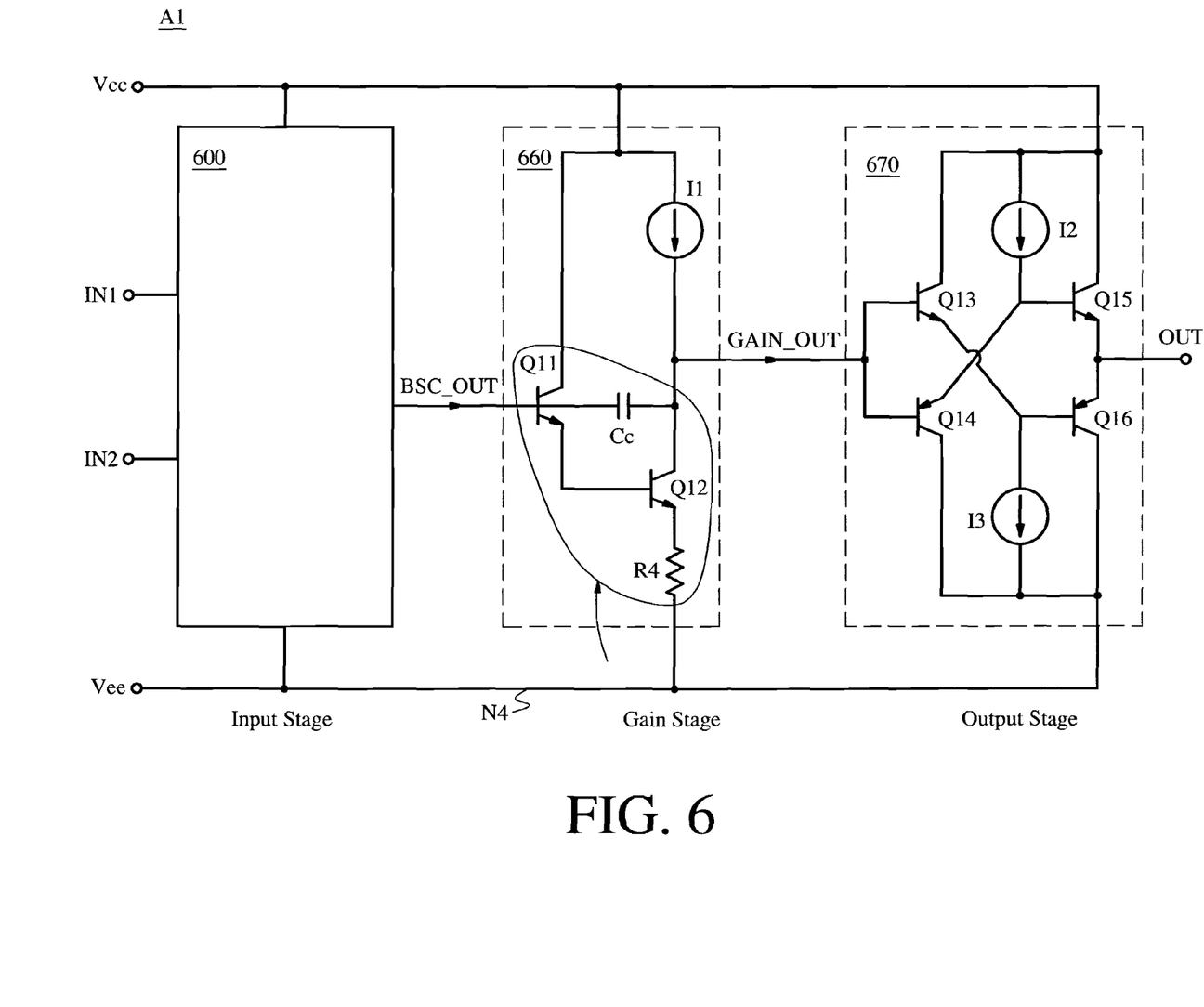
FIG. 6 illustrates a block diagram of an embodiment of an audio operational amplifier that includes the circuit of FIG. 4, arranged in accordance with aspects of the present invention.

In one embodiment of bias cancellation stage 100, the plurality of translinear elements are arranged as follows. Each of the translinear elements is a diode, a base-emitter voltage of a bipolar transistor, a gate-source voltage of a field effect transistor, or the like. Each of the translinear elements provides one diode drop or the like, where each of the diode drops is a voltage drop that is substantially equal to the others. In one embodiment, M translinear elements are coupled in series from the collector of transistor Q1 and node N4, and another M translinear elements are coupled in series from node N4 to the collector of transistor Q3. In one embodiment, the voltage at node N4 ($V_{N4}$) is M diode drops less than $V_{C,Q1}$, and voltage $V_{C,Q3}$ is M diode drops up from $V_{N4}$, so that $V_{C,Q1}$ is substantially equal to $V_{C,Q3}$. In another embodiment, the voltage at node N4 ($V_{N4}$) is M diode drops more than $V_{C,Q1}$, and voltage $V_{C,Q3}$ is M diode drops down from $V_{N4}$, so that $V_{C,Q1}$ is substantially equal to $V_{C,Q3}$. Although not shown, in some embodiments the next stage of the operational amplifier is arranged so that $V_{C,Q2}$ is substantially equal to $V_{C,Q1}$. For example, in one embodiment the next stage is arranged so that the collector of transistor Q2 is M diode drops up from node N4 (as shown in FIG. 6 in one embodiment).

In one embodiment, $V_{N4}$ is a fixed voltage, such as ground, so that $V_{C,Q1}$ and $V_{C,Q3}$ are both M diode drops up from the fixed voltage. In another embodiment, $V_{N4}$ is not a fixed voltage, but tracks changes in $V_{C,Q1}$ so that $V_{C,Q3}$ tracks changes in $V_{C,Q1}$.

In one embodiment, N translinear elements are coupled in series from the emitter of transistor Q1 and node N3, and another N translinear elements are coupled in series from node N3 to the emitter of transistor Q3. In one embodiment, the voltage at node N3 ($V_{N3}$) is N diode drops less than $V_{E,Q1}$, and voltage $V_{E,Q3}$ is N diode drops up from $V_{N3}$, so that $V_{E,Q1}$ is substantially equal to $V_{E,Q3}$. In another embodiment, the voltage at node N3 ($V_{N3}$) is N diode drops more than $V_{E,Q1}$, and voltage $V_{E,Q3}$ is N diode drops down from $V_{N3}$, so that $V_{E,Q1}$ is substantially equal to $V_{E,Q3}$. Since in one embodiment $V_{E,Q1}=V_{E,Q3}$, $V_{C,Q1}=V_{C,Q3}$, and $V_{E,Q1}=V_{E,Q2}$, $V_{CE,Q3}=V_{CE,Q1}=V_{CE,Q2}$.

Although one particular embodiment of bias canceller stage 100 is illustrated and discussed above, other embodiments are within the scope and spirit of the invention. For example, in one embodiment, the circuit may be flipped over, replacing the p-type transistor with n-type transistors, are illustrated in FIG. 2 in one embodiment.

Figure 1B:
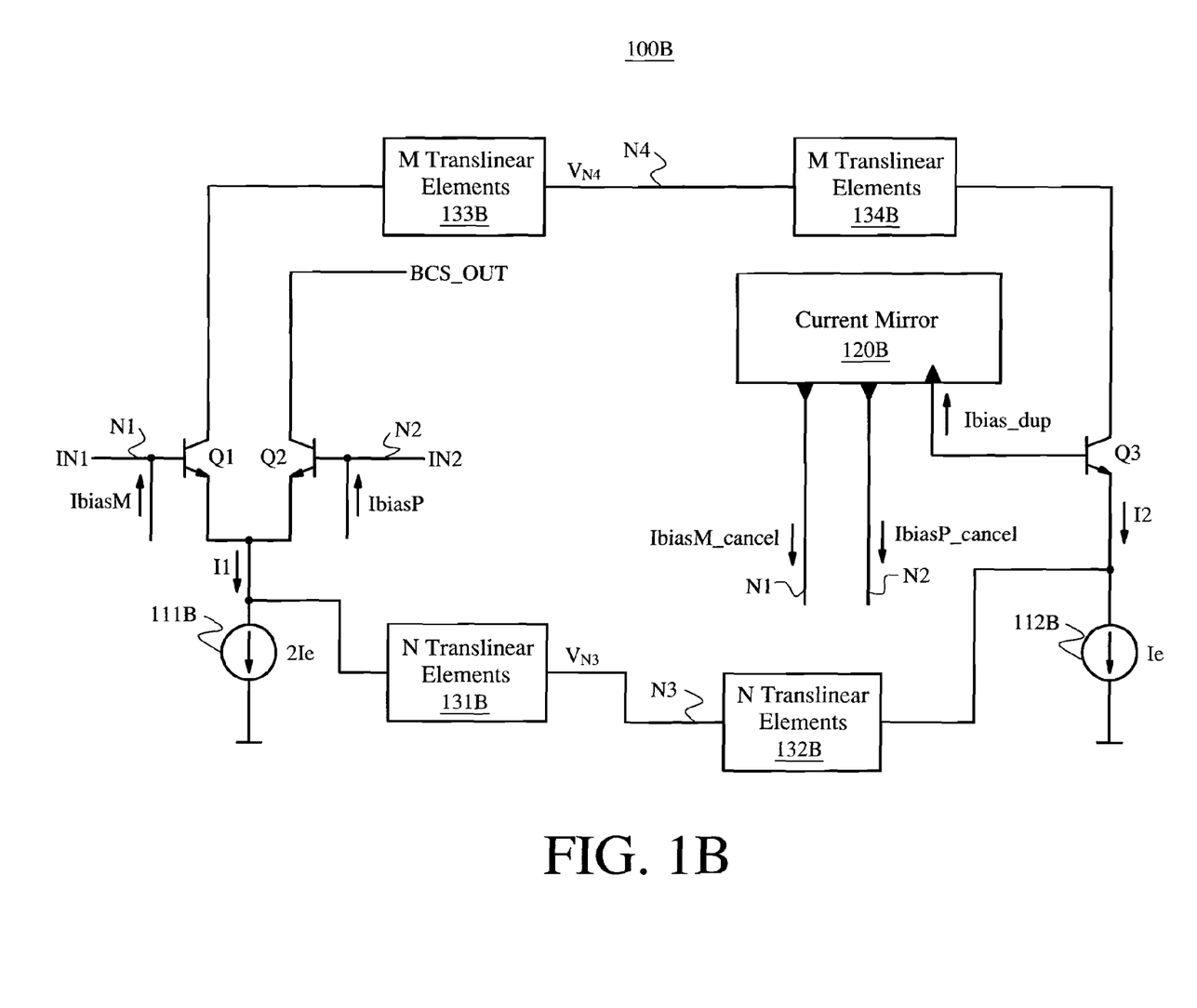
FIG. 1B illustrates a block diagram of an embodiment of the circuit of FIG. 1A.

FIG. 1B illustrates a block diagram of an embodiment of bias canceller stage 100B, which may be employed as an embodiment of bias canceller stage 100 of FIG. 1A. Bias canceller stage 100B is similar to bias canceller stage 100 of FIG. 1A, but in bias canceller stage 100B the circuit is flipped over relative to bias canceller stage 100 of FIG. 1A. In bias canceller stage 100B, bias current IbiasM and IbiasP are sinked from nodes N1 and N2 respectively, and bias cancellation current IbiasM_cancel and IbiasP_cancel are sourced from nodes N1 and N2 respectively so that input bias current is substantially cancelled.

Figure 2:
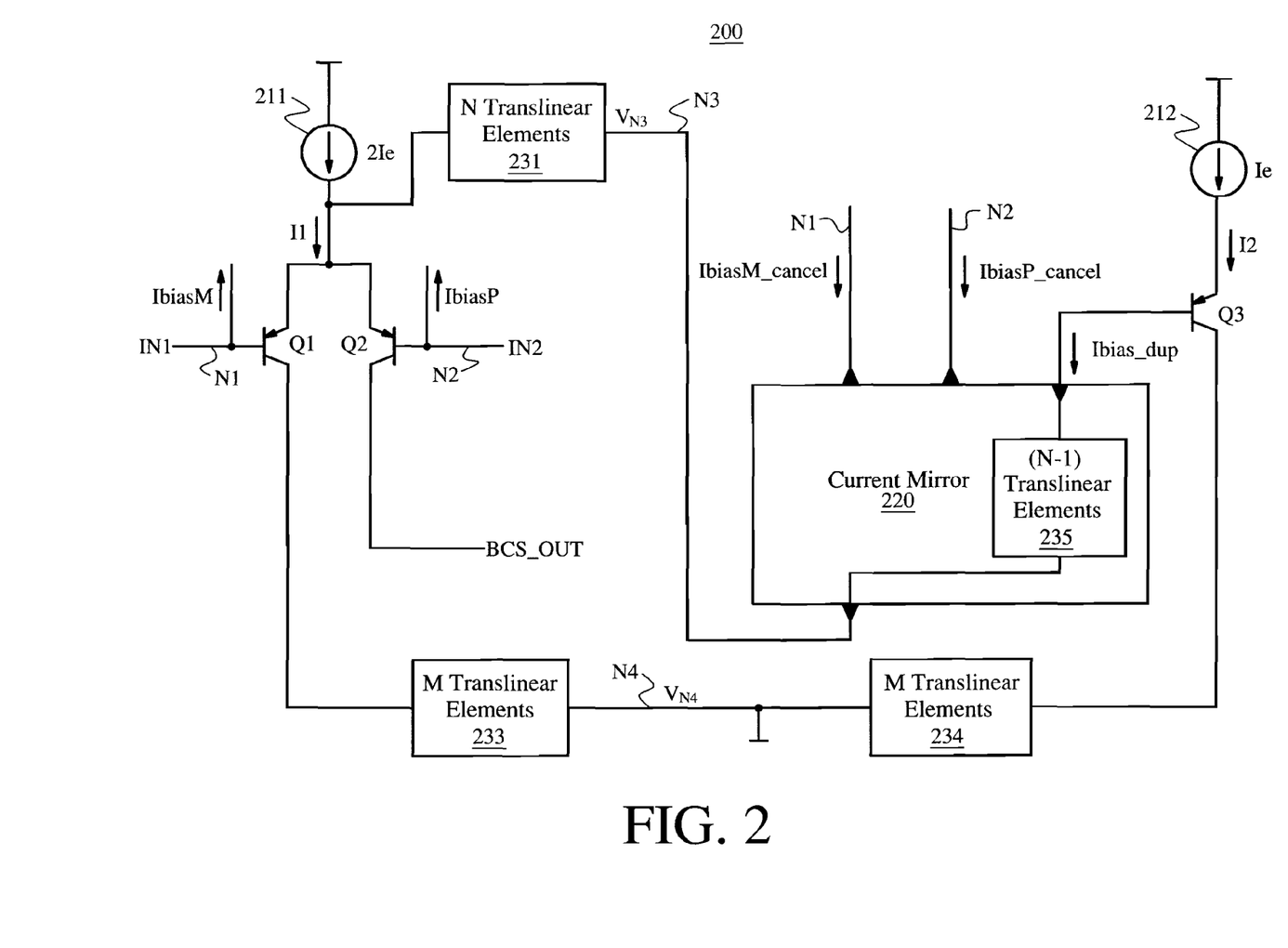
FIG. 2 illustrates a block diagram of another embodiment of the circuit of FIG. 1A.

FIG. 2 illustrates a block diagram of an embodiment of circuit 200, which may be employed as an embodiment of circuit 100 of FIG. 1A. In circuit 200, the N translinear elements 132 of FIG. 1 are embodied by N−1 translinear elements 235 that are part of current mirror 220, and the Vbe of transistor Q3. In circuit 200, N−1 translinear elements 235 are coupled in series from node N3 to the base of transistor Q3. Voltage $V_{N3}$ is N diode drops less than $V_{E,Q1}$, and voltage $V_{E,Q3}$ is (N−1) diode drops+Vbe(Q3) up from $V_{N3}$, so that $V_{E,Q1}$ is substantially equal to $V_{E,Q3}$.

Figure 3:
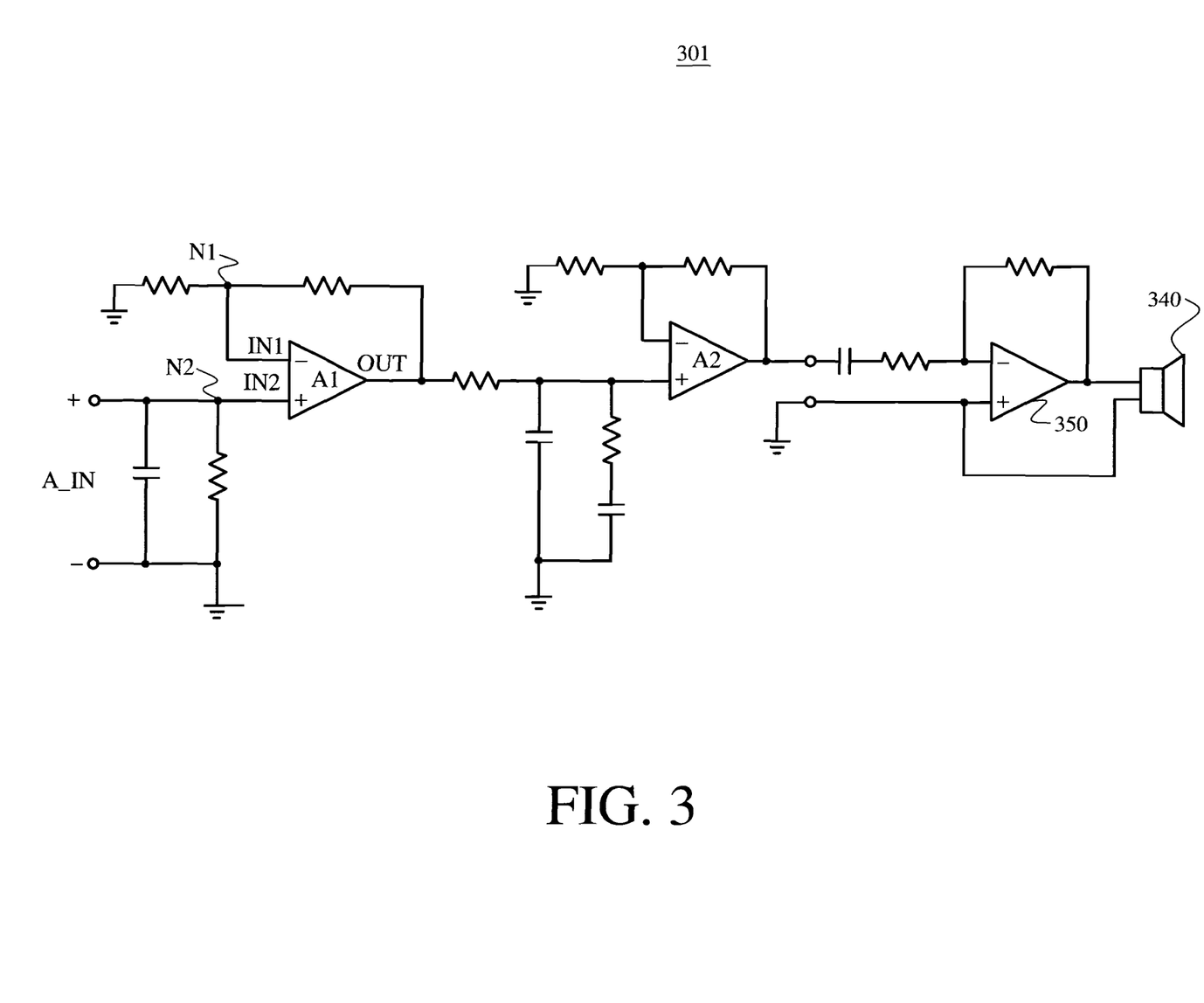
FIG. 3 shows a block diagram of an embodiment of a circuit for audio amplification that includes two audio operational amplifiers that each include an embodiment of the circuit of FIG. 1A.

FIG. 3 shows a block diagram of an embodiment of circuit 301, which may be employed for audio amplification. Circuit 301 includes audio operational amplifiers A1 and A2, audio power amplifier 350, speaker load 350, resistors, and capacitors. One or both of audio operational amplifiers A1 and A2 may include an embodiment of bias cancellation stage 100 of FIG. 1A as the input stage of the audio operational amplifier. In this way, the input bias current to the audio operational amplifier is substantially zero. Audio operational amplifier A1 is arranged to receive signals IN1 and IN2, and to provide signal OUT. One embodiment of audio operational amplifier A1 is illustrated in FIG. 6 below. Audio operational amplifier A2 may be substantially similar to operational amplifier A1.

Although circuit 301 shows only one embodiment of audio operational amplifiers for one particular application, numerous other arrangements of one of more audio operational amplifiers that include an embodiment of circuit 100 may also be used within the scope and spirit of the invention.

Figure 4:
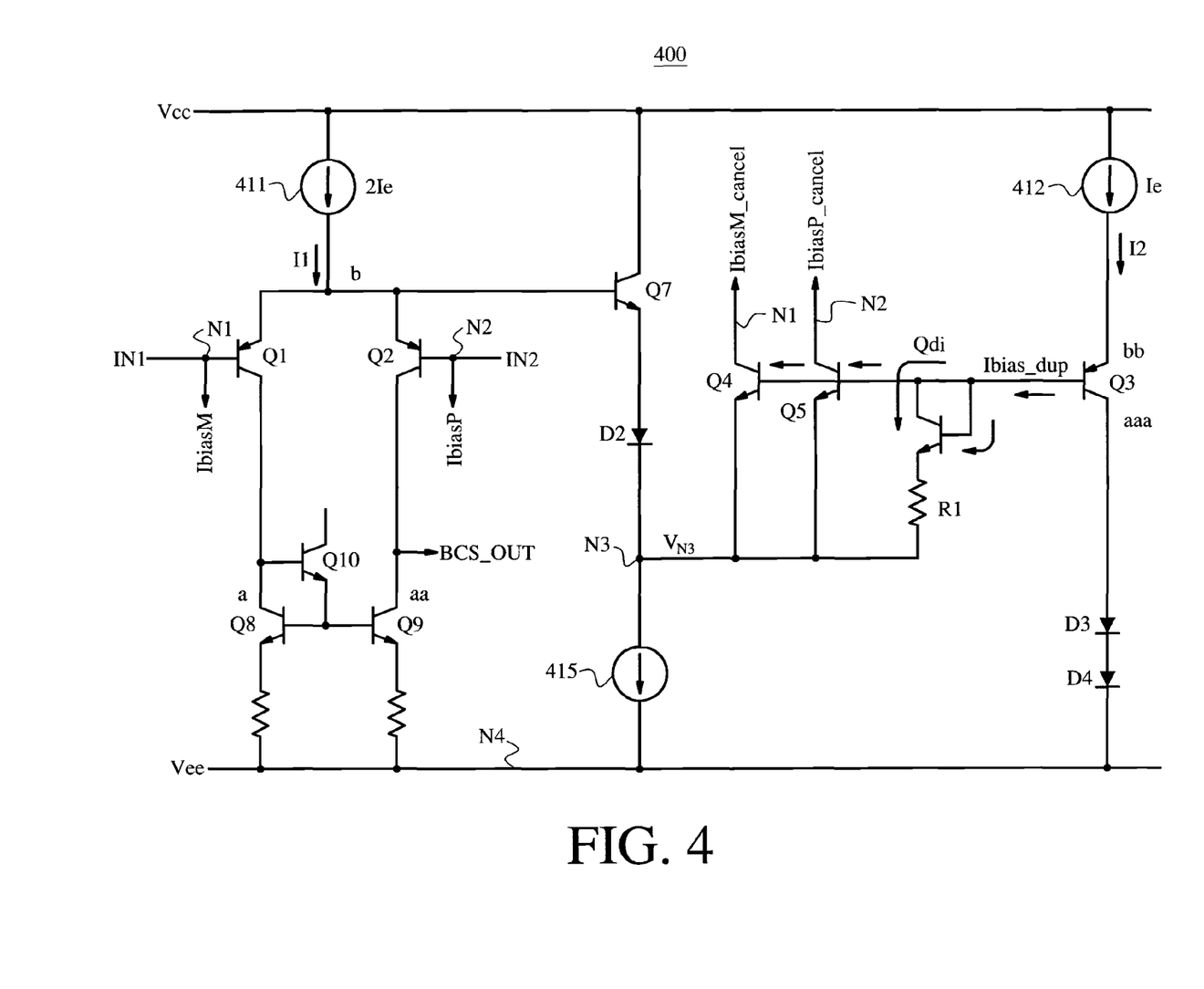
FIG. 4 illustrates a simplified schematic diagram of an embodiment of the circuit of FIG. 2.

FIG. 4 illustrates a simplified schematic diagram of an embodiment of bias canceller stage 400, which may be employed as an embodiment of bias canceller circuit 200 of FIG. 2. Current mirror 420 includes transistor Q4, transistor Q5, transistor Qdi, and optionally resistors R1, R2, and R3.

In FIG. 4, voltage $V_{C,Q1}$ is labeled a, voltage $V_{C,Q2}$ is labeled aa, voltage $V_{C,Q1}$ is labeled aaa, voltage $V_{E,Q1}$ is labeled b, and voltage $V_{E,Q3}$ is labeled bb. Voltage a is two diode drops up from Vee (Vbe of transistor Q8 or Q9 being one diode drop, and Vbe of transistor Q10 being the other), and voltage aaa is two diode drops up from VEE (diodes D3 and D4). Also, in this embodiment, the voltage associated with signal BSC_OUT is set to Vee+2Vbe in the next stage. In this embodiment, a=aa=aaa=Vee+2Vbe. Emitter resistors R2 and R3 have voltage drops that are small relative to the diode drops. Voltage $V_{N3}$ is two diode drops down from voltage b (through the Vbe of Q7 and diode D2, and voltage bb is two diode drops up from voltage $V_{N3}$ (through Vbe of Q4 or Q5 and the Vbe of transistor Q3). In the embodiment shown, b=bb=Vcm+Vbe. Current source 415 is arranged to bias transistor Q7. Although diodes D2, D3, and D4 are shown as diodes, in some embodiments they may be base-emitter junctions of a transistor, or the like.

Transistors Q4, Q5, and Qdi operate together as a current mirror. Resistor R1 is provided for current mirror correction. Resistor R1 is omitted in some embodiments. Transistors Q4, Q5, and Qdi each drawn a base current Ibias_dup/β, so that, if resistor R1 is omitted, current IbiasM_cancel and IbiasP_cancel are about Ibias_dup−3*Ibias_dup/β. However, resistor R1 may be included so that the Vbe of transistors Q4 and Q5 are slightly larger than the Vbe of transistor Qdi. The resistance R1 may be pre-selected to compensate for the −3Ibias_dup*β so that IbiasM_cancel and IbiasP_cancel are each substantially equal to current Ibias_dup.

Input bias current, which may go through input resistors or the like for an operational amplifier, may cause a voltage offset across the input resistance, pop-and-click noise, or the like. By substantially canceling the bias current, the negative effects of the input bias current may be prevented or reduced. Canceling the input bias current may be particularly beneficial for applications with a high common input impedance.

Although a particular number of diode drops is employed in the circuit illustrated in FIG. 4 is described, in other embodiments, other numbers of diode drops may be employed, so long as the topology used is such that Vce of Q3 is maintained substantially equal to Vce of Q1 and Q2.

Figure 5:
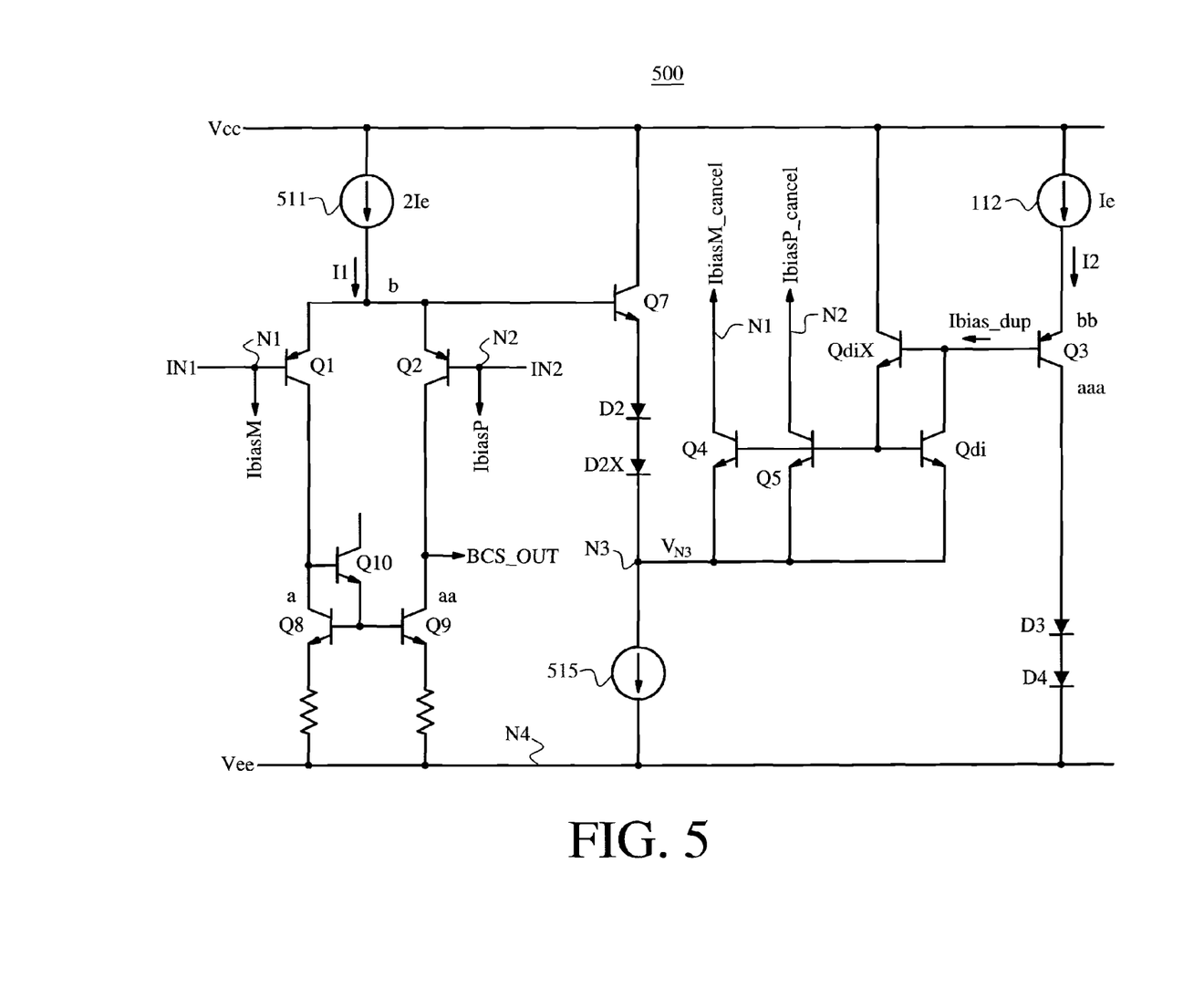
FIG. 5 shows a simplified schematic diagram of another embodiment of the circuit of FIG. 2.

FIG. 5 shows a simplified schematic diagram of bias canceller stage 500, which may be employed as an embodiment of bias canceller stage 400 of FIG. 4. Bias canceller stage 500 further includes diode D2X and transistor QdiX. Bias canceller stage 500 is similar to bias canceller stage 400 of FIG. 4, except that there are three diode drops from node N1 to node N3, and three diode drops up from node N3 to the emitter of transistor Q3. This embodiment has greater accuracy, but the common mode voltage range is reduced by Vbe.

FIG. 6 illustrates a block diagram of an embodiment of audio operational amplifier A1, which includes an embodiment (600) of bias cancellation stage 400 of FIG. 4. Audio operational amplifier A1 includes input stage/bias cancellation stage 600, gain stage 660, and output stage 670. Gain stage 660 includes transistor Q11, transistor Q12, resistor R4, capacitor Cc, and current source I1. Output stage 670 includes transistors Q13-Q16 and current sources 12 and 13.

Gain stage 660 is arranged such that the voltage at the collector of transistor Q2 (of FIG. 4) is two diode drops up from Vee (due to the Vbe of transistor Q11 and Q12, with the voltage drop of resistor R4 being substantially negligible). Gain stage 660 is arranged to provide signal GAIN_OUT from signal BSC_OUT. Output stage 670 is arranged to provide signal OUT from signal GAIN_OUT.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for audio amplification, comprising:
   an input differential pair including a first bipolar transistor having at least a base, a collector, and an emitter; and a second bipolar transistor having at least a base, a collector, and an emitter;
   a bias current duplicator transistor having at least a base, a collector, and an emitter;
   a plurality of translinear elements that are arranged such that a voltage between the collector and the emitter of the bias current duplicator transistor is substantially the same as a voltage between the collector and the emitter of the first bipolar transistor; and
   a current mirror having at least an input that is coupled to the base of the bias current duplicator transistor, a first output that is coupled to the base of the first bipolar transistor, and a second output that is coupled to the base of the second bipolar transistor, wherein
   the plurality of translinear elements include:
      N translinear elements arranged to provide N diode drops down from the emitter of the first transistor to a first node;
      N translinear elements arranged to provide N diode drops up from the first node to the emitter of the bias current duplicator transistor;
      M translinear elements arranged to provide M diode drops down from the collector of the first transistor to a second node; and
      M translinear elements arranged to provide M diode drops up from the second node to the collector of the bias current duplicator transistor.

2. The circuit of claim 1, wherein each of the translinear elements is at least one of a diode, a base-emitter junction of a bipolar transistor, or a gate-source junction of a field effect transistor.

3. The circuit of claim 1, wherein the input differential pair is arranged to source a bias current at the base of the first and second transistors, and wherein the current mirror is arranged to sink a duplicate bias current at the base of the first and second transistor, wherein the duplicate bias current is substantially equal to the bias current, whereby the bias current is substantially cancelled.

4. The circuit of claim 1, wherein the input differential pair is arranged to sink a bias current at the base of the first and second transistors, and wherein the current mirror is arranged to source a duplicate bias current at the base of the first and second transistor, wherein the duplicate bias current is substantially equal to the bias current.

5. The circuit of claim 1, further comprising:
   a current source that is arranged to provide a first emitter current to a common emitter of the input differential pair; and
   a duplicate current source that is arranged to provide a second emitter current to the emitter of the bias current duplicator transistor such that the second emitter current is about half of the first emitter current.

6. The circuit of claim 1, further comprising an audio operational amplifier, wherein the input differential pair is a first stage of the audio operational amplifier.

7. A circuit for audio amplification, comprising:
   an input differential pair including a first bipolar transistor having at least a base, a collector, and an emitter; and a second bipolar transistor having at least a base, a collector, and an emitter;
   a bias current duplicator transistor having at least a base, a collector, and an emitter;

a plurality of translinear elements that are arranged such that a voltage between the collector and the emitter of the bias current duplicator transistor is substantially the same as a voltage between the collector and the emitter of the first bipolar transistor; and a current mirror having at least an input that is coupled to the base of the bias current duplicator transistor, a first output that is coupled to the base of the first bipolar transistor, and a second output that is coupled to the base of the second bipolar transistor wherein the plurality of translinear elements include:
N translinear elements arranged to provide N diode drops up from the emitter of the first transistor to a first node;
N translinear elements arranged to provide N diode drops down from the first node to the emitter of the bias current duplicator transistor;
M translinear elements arranged to provide M diode drops up from the collector of the first transistor to a second node; and
M translinear elements arranged to provide M diode drops down from the second node to the collector of the bias current duplicator transistor.

8. The circuit of claim 1, wherein each of the diode drops is a base-emitter voltage of a bipolar transistor.

9. The circuit of claim 1, wherein the N translinear elements that are arranged to provide N diode drops up from the first node to the emitter of the first bias current duplicator transistor include: N−1 translinear elements that are arranged to provide N−1 diode drops up from the first node to the base of the bias current duplicator transistor, and the base-emitter junction of the bias current duplicator transistor.

10. The circuit of claim 9, wherein the N−1 translinear elements are part of the current mirror.

11. The circuit of claim 1, wherein
the current mirror is approximately a 1:1:1 current mirror, and wherein the current mirror includes:
a first current mirror transistor having at least a base that is coupled to the base of the current duplicator transistor, a collector that is coupled to the base of the first current mirror transistor, and an emitter that is coupled to a node;
a second current mirror transistor having at least a base that is coupled to the base of the first current mirror transistor, a collector that is coupled to the base of the first bipolar transistor, and an emitter that is coupled to the node; and
a third current mirror transistor having at least a base that is coupled to the base of the first current mirror transistor, a collector that is coupled to the base of the second bipolar transistor, and an emitter that is coupled to the node.

12. A circuit for audio amplification, comprising:
an input differential pair including a first bipolar transistor having at least a base, a collector, and an emitter; and a second bipolar transistor having at least a base, a collector, and an emitter;
a bias current duplicator transistor having at least a base, a collector, and an emitter;
a plurality of translinear elements that are arranged such that a voltage between the collector and the emitter of the bias current duplicator transistor is substantially the same as a voltage between the collector and the emitter of the first bipolar transistor; and
a current mirror having at least an input that is coupled to the base of the bias current duplicator transistor, a first output that is coupled to the base of the first bipolar transistor, and a second output that is coupled to the base of the second bipolar transistor, wherein
the current mirror is approximately a 1:1:1 current mirror, and wherein the current mirror includes:
a first current mirror transistor having at least a base that is coupled to the base of the current duplicator transistor, a collector that is coupled to the base of the first current mirror transistor, and an emitter that is coupled to a node;
a second current mirror transistor having at least a base that is coupled to the base of the first current mirror transistor, a collector that is coupled to the base of the first bipolar transistor, and an emitter that is coupled to the node;
a third current mirror transistor having at least a base that is coupled to the base of the first current mirror transistor, a collector that is coupled to the base of the second bipolar transistor, and an emitter that is coupled to the node; and
the current mirror further includes:
a resistor that is coupled between the emitter of the first current mirror transistor and the node.

13. The circuit of claim 12, wherein the resistor has a resistance such that the base-emitter junctions of the second and third current mirror transistor are such that the collector currents of the second and third transistors are each substantially the same as the base current of the bias current duplicator transistor, compensating for the base current of each of the transistors in the current mirror.

14. A method for audio amplification, comprising:
providing an emitter current to a bias current duplicator transistor such that the emitter current of the bias current duplicator transistor is substantially the same as the emitter current of each transistor of an input differential pair;
providing emitter and collector voltages of the bias current duplicator transistor such that the collector-emitter voltage of the bias current duplicator transistor is substantially the same as each of the transistors in the input differential pair;
mirroring a base current of the bias current duplicate transistor to a base of first transistor of the input differential pair and to a base of the second transistor of the input differential pair, wherein
providing the emitter and collector voltage of the bias current duplicator transistor includes:
providing N diode drops down from the emitter of the first transistor to a first node;
providing N diode drops up from the first node to the emitter of the bias current duplicator transistor;
providing M diode drops down from the collector of the first transistor to a second node; and
providing M diode drops up from the second node to the collector of the bias current duplicator transistor.

15. The method of claim 14, wherein the input differential pair sources a bias current at the base of the first and second transistors, and wherein mirroring the base current includes sinking a duplicate bias current to the base of the first and second transistors, wherein the duplicate bias current is substantially equal to the bias current.

16. The method of claim 14, wherein the input differential pair sinks a bias current at the base of the first and second transistors, and wherein mirroring the base current includes sourcing a duplicate bias current to the base of the first and second transistors, wherein the duplicate bias current is substantially equal to the bias current.

* * * * *